United States Patent [19]

Hawrylo

[11] 4,195,308

[45] Mar. 25, 1980

[54] OHMIC CONTACT FOR P TYPE INDIUM PHOSPHIDE

[75] Inventor: Frank Z. Hawrylo, Trenton, N.J.

[73] Assignee: RCA Corporation, New York, N.Y.

[21] Appl. No.: 903,117

[22] Filed: May 5, 1978

[51] Int. Cl.² ........................................... H01L 23/48
[52] U.S. Cl. ........................................ 357/67; 357/61
[58] Field of Search ..................................... 357/61, 67

[56] References Cited

U.S. PATENT DOCUMENTS

| | | |
|---|---|---|
| 3,324,361 | 6/1967 | Belasco et al. .......................... 357/67 |
| 3,684,930 | 8/1972 | Collins et al. .......................... 357/67 |
| 3,982,261 | 9/1976 | Antypas ................................ 357/67 |
| 4,025,944 | 5/1977 | Moon .................................... 357/67 |

Primary Examiner—Edward J. Wojciechowicz
Attorney, Agent, or Firm—H. Christoffersen; D. S. Cohen

[57] ABSTRACT

A body including P type indium phosphide has an ohmic contact thereon of an alloy of by weight 81% to 86% gold (Au), 11% to 14% germanium (Ge) and 2% to 5% zinc (Zn). This contact has a low resistance and good adhesion to the indium phosphide body.

7 Claims, 1 Drawing Figure

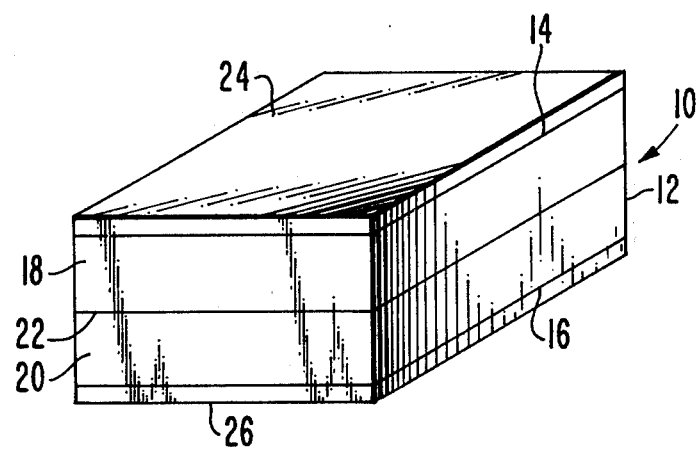

OHMIC CONTACT FOR P TYPE INDIUM PHOSPHIDE

The invention described herein was made in the performance of work under a NASA contract and is subject to the provisions of section 305 of the National Aeronautics and Space Act of 1958, Public Law 85-568 (72 L Stat. 435; 42 U.S.C. 2457).

The present invention relates to an ohmic contact for P type indium phosphide and particularly to such a contact which has low resistance and good adherence to indium phosphide.

There has been considerable interest in the use of single crystalline semiconductor materials of the Group III-V compounds and alloys of such compounds for various semiconductor devices, particularly electroluminescent semiconductor devices such as light emitting diodes and laser diodes. One of the Group III-V compounds which has been receiving recent attention is indium phosphide and alloys of indium phosphide and other Group III-V compounds. In making semiconductor devices with the Group III-V compounds it is necessary to provide an ohmic contact to the material in order to permit ease of electrically connecting such semiconductor devices in a circuit with other devices. Such ohmic contact should have a low resistance, about 1 ohm, and should adhere well to the semiconductor material. In the use of indium phosphide as the semiconductor material it has been found to be difficult to provide a good ohmic contact for P type indium phosphide. Although an alloy of gold and zinc, which includes 2% to 5% by weight of zinc, has been found to have a low resistance to P type indium phosphide, this alloy does not always adhere well to the indium phosphide.

The FIGURE of the drawing is a form of a semiconductor device embodying the present invention.

Referring to the drawing, a semiconductor device, generally designated as 10, includes a body 12 of single crystalline indium phosphide having a pair of opposed surfaces 14 and 16. The body 12 includes a first region 18 of P type conductivity and a second region 20 of N type conductivity forming a PN junction 22 therebetween. The P type region 18 extends to the surface 14 of the body 12 and the N type region 20 extends to the surface 16. On the surfaces 14 and 16 are contacts 24 and 26 respectively, of a conductive material which has a low resistance and adheres well to the material at their respective surfaces.

The contact 24 on the P type region 18 comprises an alloy of 81% to 86% by weight of gold (Au), 11% to 14% by weight of germanium (Ge) and 2% to 5% by weight of zinc (Zn). Hereinafter, all percentages are by weight. The germanium in the alloys acts as a wetting agent to provide good adherence between the contact 24 and the P type indium phosphide. The amount of germanium in the alloy is important since either below about 11% or above about 14% the melting temperature of the alloy is raised. As will be explained further, this adversely affects the application of the alloy to the semiconductor body by the well known technique of evaporation in a vacuum. In the range of about 11% to 14% germanium, the melting temperature of the alloy is at about the eutectic, which is a relatively low temperature. When applying the alloy to the surface 14 by evaporation in a vacuum, it is desirable to evaporate the gold and germanium, particularly the germanium, substantially simultaneously with the zinc, which has the highest vapor pressure. If too much of the zinc is evaporated first, it will prevent the germanium from wetting the surface 14 and will not permit good adhesion to the P type indium phosphide. By having the melting temperature of the alloy at the low eutectic, the alloy can be evaporated at lower temperatures to achieve the evaporation of the germanium and gold along with the zinc with a good degree of constituent uniformity and thereby achieve the good adhesion of the alloy to the P type indium phosphide. Although this alloy does include germanium, it also contains a sufficient amount of zinc, which is an acceptor for indium phosphide, to retain a low resistance. The low melting temperature of the alloy also permits the use of lower sintering temperatures, about 380° C. for three minutes, so that the semiconductor device itself is not adversely affected by sintering the contact.

The contact 26 on the surface 16 of the N type region 20 may be of any well known material which makes good ohmic contact to indium phosphide, such as an alloy of gold and tin containing about 20% tin, or tin alone or germanium. The contact 26 may also be applied by evaporation in a vacuum.

EXAMPLE

An alloy suitable for a contact for the present invention was made by mixing together 8.428 grams of gold, 1.372 grams of germanium and 0.2 gram of zinc. The mixture was placed in a cleaned quartz ampoule and evacuated to about $5 \times 10^{-5}$ mm mercury. The ampoule was then sealed to include therein a volume of about 6 cc. The ampoule containing the metals was placed in a furnace in a tilted position to retain the metals at one end of the ampoule. The ampoule was heated in a furnace at a temperature of about 800° to 850° C. for thirty minutes. The ampoule was then removed from the furnace and quenched in water to lessen or stop the segregation or separation of the constituents of the resultant alloy. The ampoule was then broken and the alloy was removed and cut into small chunks. This alloy contained by weight about 84% gold, 14% germanium and 2% zinc.

A chunk of the alloy was then placed on a ribbon filament of either molybdenum or tungsten and heated until the alloy melted and adhered to the filament. The filament with the alloy thereon was mounted in a chamber over a body of indium phosphide. The indium phosphide body was positioned with the surface of a P type region facing the filament. The filament was about 3 inches (7.62 cm) from the surface of the body. The chamber was sealed and evacuated to about $5 \times 10^{-5}$ mm mercury.

The filament was heated to the evaporation temperature of the alloy by providing a current through the filament. A metal shield was provided between the filament and the indium phosphide body while the filament was heating up. A current of about 60 amps was used to heat up the filament. When the alloy started to evaporate, the shield was moved to allow the vapors to contact the surface of the indium phosphide body. After about two minutes the shield was placed back between the filament and the body to stop the coating process. The heating of the filament was discontinued and the pressure in the chamber was returned to atmospheric pressure to permit removal of the body with the contact thereon.

Although the above method of evaporating the alloy onto the indium phosphide body is satisfactory, a more preferred technique is to place the piece of alloy in a boat-shaped filament of molybdenum or tungsten which is mounted in a chamber beneath the indium phosphide body. The indium phosphide body is spaced from the filament a distance of at least 6 inches (15.24 cm) to minimize heating of the body by the hot filament and to obtain a more uniform coating of the alloy on the surface of the body. The chamber is hermetically sealed and evacuated as described above. The filament is then heated to cause evaporation of the alloy with the vapors diffusing upwardly to contact the surface of the indium phosphide body and deposit thereon.

I claim:

1. A semiconductor device comprising:
   a body including a region of P type indium phosphide, and
   a contact on said P type indium phosphide region, said contact comprising an alloy of gold, germanium and zinc in which the germanium is present in an amount of 11% to 14% by weight.

2. A semiconductor device in accordance with claim 1 in which the contact includes 2% to 5% by weight of the zinc.

3. A semiconductor device in accordance with claim 2 in which the contact includes 81% to 86% by weight of the gold.

4. A semiconductor device in accordance with claim 1 in which the body has a pair of opposed surfaces, the P type region extends to one of said surfaces, an N type region extends to the other surface.

5. A semiconductor device in accordance with claim 4 in which the contact includes 2% to 5% by weight of the zinc.

6. A semiconductor device in accordance with claim 5 in which the contact includes 81% to 86% by weight of the gold.

7. A semiconductor device in accordance with claim 4 including a second contact on said other surface, said second contact being of a conductive material which makes good ohmic contact with the material of the N type region.

* * * * *